United States Patent [19]
Ferrant

[11] Patent Number: 5,898,622
[45] Date of Patent: Apr. 27, 1999

[54] READ CIRCUIT FOR MEMORY

[75] Inventor: Richard Ferrant, St Ismier, France

[73] Assignee: SGS-Thomson Microelectronics, S.A., Gentilly, France

[21] Appl. No.: 08/970,844

[22] Filed: Nov. 14, 1997

[30] Foreign Application Priority Data

Sep. 10, 1997 [FR] France ................................. 96 14775

[51] Int. Cl.$^6$ ................................................. G11C 7/00
[52] U.S. Cl. ..................... 365/189.01; 365/206; 365/207
[58] Field of Search .............................. 365/189.01, 205, 365/206, 207, 208

[56] References Cited

U.S. PATENT DOCUMENTS

| | | | |
|---|---|---|---|
| 5,163,022 | 11/1992 | Homma et al. | 365/206 |
| 5,199,000 | 3/1993 | Takahashi | 365/189.09 |
| 5,373,469 | 12/1994 | Akioka et al. | 365/208 |
| 5,563,826 | 10/1996 | Pascucci et al. | 365/185.21 |
| 5,734,616 | 3/1998 | Kazama et al. | 365/207 |

FOREIGN PATENT DOCUMENTS 0 488 327 A2  6/1992  European Pat. Off. .......... G11C 7/06

OTHER PUBLICATIONS

Izumikawa et al., IEICE Trans. Electron., vol. E79, No. 7, (Jul. 7, 1996), pp. 957–962, "*A Current Direction Sense Technique for Multiport SRAM's*".

Watanbe et al., IEEE Journal of Solid–State Circuits, vol. 29, No. 1, (Jan. 29, 1994), pp. 9–13, "*Offset Compensating Bit–Line Sensing Scheme for High Density DRAM'*".

Primary Examiner—Son T. Dinh
Attorney, Agent, or Firm—Allen, Dyer, Doppelt, Milbrath & Gilchrist, P.A.

[57] ABSTRACT

A memory read circuit includes an input to be connected to a bit line to which there are connected memory cells, and an output to produce an output logic potential. A current source produces a first current and a current-voltage converter produces the output logic potential. This potential represents the value of a second current obtained by the rerouting of a part of the first current towards the bit line when one of the cells is read, so that once the bit line is charged, the value of this second current is determined solely by the state of the selected cell and is independent of the equivalent capacitive load of the bit line.

17 Claims, 2 Drawing Sheets

5,898,622

READ CIRCUIT FOR MEMORY

FIELD OF THE INVENTION

The invention relates to memories in integrated circuit form and, more particularly, to circuits that can be used to detect the state of the cells of a memory.

BACKGROUND OF THE INVENTION

Memories are conventionally organized into matrices of storage cells. The cells of a given column are connected to one or more bit lines. In the non-volatile memories (of the ROM, EPROM, EEPROM or Flash EPROM type), the cells are connected to a bit line. In static random-access memories (SRAMs) these cells are connected to two bit lines that are complementary to each other. The cells of a given row are connected to a word line. The bit line (or complementary bit lines) make it possible to transmit information on the state of a storage cell located at the intersection between this bit line and a selected word line.

The read circuits are connected to the bit lines of the columns, possibly by means of a multiplexer if one read circuit is used for several columns. Typically, the reading of a cell includes producing a logic signal representing the value of an electrical current that goes through this cell. This value depends on the state of the cell. If we consider, for example, a non-volatile memory, the cells may have a state called a blank state (or a programmed state depending on the convention chosen) in which they can let through a current, and a state called a programmed state (or blank state depending on the convention chosen) in which they counter the passage of the current. To read the information on the state of a cell, the equivalent capacitance of the bit line to which this cell is connected is used. This capacitance is generally in the range of one picofarad. It is sought to detect the presence of a current for the charging or discharging of the bit line connected to the cell.

In general, a differential reading is used. Thus, in the non-volatile memories, a reference line similar to the bit line is generally used. This reference line conducts a reference current during the read operation. In SRAMs, the two complementary bit lines connected to the cells are used. The reading is done by using a differential amplifier to compare the potentials present, firstly, in the bit line and, secondly, in the reference line or the complementary bit line. These potentials vary according to whether these lines are charged or discharged.

One problem arising out of this type of circuit is the influence of the value of the equivalent capacitive load of the line or lines on the time required for read access to the contents of the cells. This equivalent capacitive load is related to the geometrical parameters of the lines and the state of the cells connected to these lines. The greater this load, the greater is the time needed for the reading. Since the access time is variable, there can be no certainty that a read operation has been performed except after a period of time corresponding to the reading at theoretical maximum equivalent load, even if the reading may, in practice, be faster.

It is also necessary to take into account the differences in capacitive load between the lines. If the lines are charged differently, the times of stabilization of the potentials on these lines are different. In addition to the times of stabilization of the potentials, it is also appropriate to take into account the influence of the difference in load on the operation of the reading device connected to the lines. If the device is sensitive to this influence, then it is necessary to plan for an additional time margin in the guaranteed read access time.

Finally, the current trend is to propose circuits that can be custom-built by means of modules, especially circuits comprising memories with sizes suited to the applications. In practice, the influence of the capacitive load makes it necessary to adapt the implementation of the read circuits on an individual basis, in taking into account the size of the memory to be made.

SUMMARY OF THE INVENTION

An aim of the invention is to provide an improved read circuit that minimizes the influence of the line capacitive load.

To achieve this aim, it is proposed to use a read circuit that takes a current measurement. More specifically, it is proposed to detect the presence or absence of current in a cell, the line remaining charged at an appreciably stable potential.

Thus, the invention relates to a read circuit for a memory comprising at least one first input to be connected to a bit line to which memory cells are connected and one output to produce an output logic potential. A current source produces a first current. A current-voltage converter produces the output logic potential, this potential representing the value of a second current obtained by the rerouting of a part of the first current towards the bit line when one of the cells is read. Accordingly, once the bit line is charged, the value of this second current is determined solely by the state of the selected cell and is independent of the capacitive load of the bit line.

BRIEF DESCRIPTION OF THE DRAWINGS

Other advantages and characteristics shall appear from the following description of an exemplary embodiment of the invention, to be read with reference to the appended drawings of which.

DETAILED DESCRIPTION OF THE PREFERRED EMBODIMENTS

Figure 1:
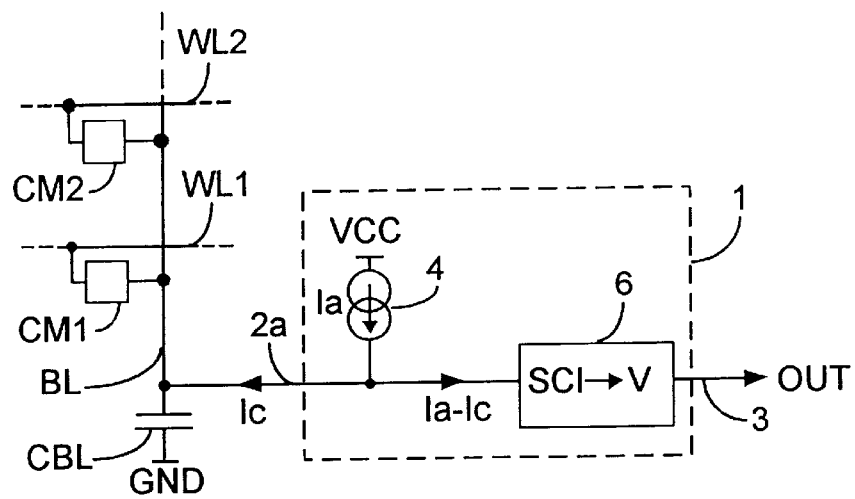
FIG. 1 shows a read circuit made according to the invention.

FIG. 1 shows a read circuit 1 made according to the invention. It has an input 2a and an output 3, a current source 4 and a current-voltage converter 6. The source 4 produces a current Ia. The output 3 gives an output logic potential OUT.

The current source 4 is connected between the input 2a and a supply terminal receiving a supply potential VCC. The converter 6 has an input connected to the input 2a and an output producing the potential OUT. The current source provides a current Ic to the input 2a and a current Ia-Ic to the converter. The value of the output potential OUT represents the value of the current Ia-Ic and provides information on the state of the cells read, the value of the current Ic representing the state of the cells read.

To enable the reading of the contents of cells CM1, CM2 ... connected to a bit line BL and to word lines WL1, WL2 ..., the bit line BL is connected to the input 2a. This bit line has an equivalent capacitance represented in FIG. 1 by a capacitor CBL mounted between the input 2a and a ground, with a potential labeled GND.

Let it be assumed that the capacitor CBL is charged. At its terminals, it has a voltage appreciably equal to VCC. If a cell that lets through a current is read, then there will be Ia−Ic<Ia. If the cell does not let through current, then Ia−Ic=Ia Ia. The equivalent capacitance of the line to which the cells are connected, once they are charged at VCC, does not vary. Thus a very fast access time is ensured, independent of the value of the equivalent capacitance of the line.

Figure 2:
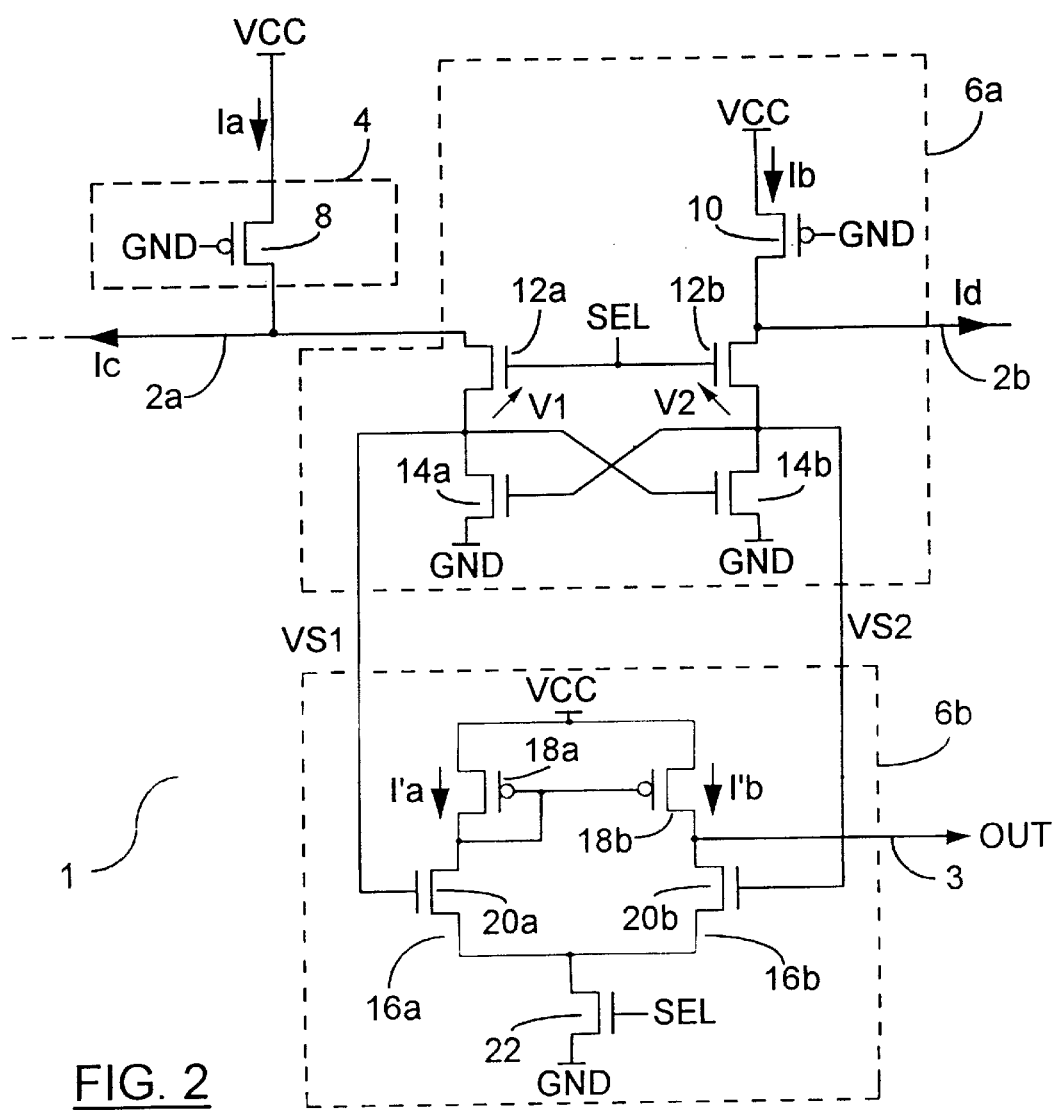
FIG. 2 is a detailed view of an exemplary embodiment of a read circuit according to the invention.

FIG. 2 gives a detailed view of an exemplary embodiment of the read circuit 1 made according to the invention. It has a second input 2b. As shall be seen further below, the circuit illustrated in FIG. 2 makes it possible, if need be, to carry out a differential reading.

The current source 4 comprises a P channel MOS type transistor 8 whose control gate receives a constant potential making it possible to regulate the current flowing through it. In the example, it is assumed that the gate receives the potential GND. The transistor 8 receives the potential VCC at its source. Its drain is connected to the input 2a.

The current-voltage converter 6 includes a first current-voltage conversion stage 6a and a second voltage-voltage conversion stage 6b. The first stage 6a produces a potential difference VS2−VS1 from the current Ic given at the output 2a by the transistor 8. The second stage 6b produces the output potential OUT from the potential difference VS2−VS1.

The first stage 6a comprises a current source providing a current labeled Ib. In the example shown, the current source of the stage 6a is made by using a P channel MOS type transistor 10. The control gate of this transistor is at the potential GND and its source is at the high potential VCC.

The stage 6a furthermore includes two N channel MOS type transistors 12a and 14a series-connected between a node receiving the potential GND and the drain of the transistor 8. It also includes two N channel MOS type transistors 12b and 14b series-connected between a node receiving a potential GND and the drain of the transistor 10.

The drains of the transistors 12a and 12b are connected to the drains of the transistors 8 and 10. The transistors 12a and 12b are used, concurrently with the transistors 14a and 14b, as current-voltage converters. The control gates of the transistors 12a and 12b receive a control potential SEL. Preferably, the potential SEL is variable and makes it possible to turn the transistors on or off depending on its value. The potential SEL will be, for example, equal to VCC to turn the transistors on and equal to GND to turn them off. The transistors 12a and 12b are then also used as selection transistors. When the read circuit is used to read cells, these transistors are on. When the read circuit is not used, these transistors are off. That makes it possible to cut off the consumption of the stage 6a, which is advantageous for the so-called onboard memories which are powered by batteries. The transistors 12a and 12b may not be used as selection transistors. In this case, the potential SEL can be fixed and it is chosen so that these transistors are on.

The drain of the transistor 12a corresponds to the input 2a. The transistors 12a and 14a are traversed by the current Ia−Ic. The drains of the transistors 10 and 12b correspond to the input 2b. The current given by transistor 10 at the input 2b is referenced Id. The transistors 12b and 14b are traversed by a current Ib−Id.

The drains of the transistors 14a and 14b are connected to the sources of the transistors 12a and 12b. The control gates of the transistors 14a and 14b are respectively connected to the drain of the transistor 14b and the drain of the transistor 14a. Their sources are at the potential GND. The potential of the drain of the transistor 14a is referenced VS1 and the potential of the drain of the transistor 14b is referenced VS2.

The potentials VS1 and VS2, having a value ranging between VCC and GND, are the potentials provided to the second stage 6b to produce the output potential OUT.

Preferably the transistors 8 and 10 are matched. The transistors 12a and 12b, on the one hand, and 14a and 14b, on the other hand, are preferably matched in sets of two so that the arms formed by the triplets of transistors (8, 12a, 14a) and (10, 12b, 14b) are identical. In addition, transistors 12a and 12b will be chosen such that they are identical to the transistors 14a and 14b or slightly smaller in size to compensate for their threshold voltage, which is slightly greater for an identical size, owing to the substrate effect.

The stage 6b is a standard differential amplifier. It has two arms 16a and 16b. The arms are traversed by currents I'a and I'b provided by a standard type of current mirror. The current mirror is formed by two P channel MOS type transistors 18a and 18b whose sources are at the potential VCC and whose control gates are connected to one another. The control gate and the drain of the transistor 18a, which is used as a reference transistor, are connected to each other. This transistor provides the current I'a. The transistor 18b, which is used as a copying transistor, gives the current I'b.

The arms 16a and 16b include N channel MOS type transistors 20a and 20b forming a differential pair. The drains of these transistors are connected respectively to the drains of the transistors 18a and 18b. Their sources are connected, firstly, to each other and, secondly, to a node carried to the potential GND by means of a transistor 22. The transistor 22 is an N channel MOS type transistor. At its control gate, it receives a control potential by which it can be turned on or off. In the example, the transistor 22 receives the potential SEL. The transistor 22, which is optional, enables the consumption of the stage 6b to be cut off when the circuit 1 is not used. The control gates of the transistors 20a and 20b are connected, respectively, to the drains of the transistors 14a and 14b and receive the potentials VS1 and VS2. The output 3 of the circuit 1 corresponds to the drain of the transistor 20b.

A description shall now be given of the operation of the read circuit 1 illustrated in FIG. 2 in assuming, initially, that it is used to read a non-volatile type of memory in which the cells are made of transistors that are on or off depending on the nature of the information stored by these cells. These cells are connected to bit lines. To read the cells of a bit line, this line is connected to the input 2a.

It is assumed that the current mirror of the stage 6b has a ratio smaller than 1 (I'a>I'b) such that the potential OUT is equal to the potential VCC (corresponding typically to a high logic state) when the potentials VS1 and VS2 are identical. Let it be assumed that the read circuit is selected (the transistors 12a, 12b and 22 are then on). Once the equivalent capacitor of the bit line is charged, we have Ia−Ic=Ia=Ib so long as no cell of the bit line is selected by the word line that corresponds to it. Let V1, be the gate-source voltage of the transistor 12a and V2 the gate-source voltage of the transistor 12b. Then V1=V2 and VS1=VS2.

If a cell of the bit line is selected and if this cell is on (blank state), a non-zero current Ic provided by the transistor 8 goes through this cell. The transistor 12a is then traversed by a current Ia−Ic lower than Ib. Consequently, the voltage VI will increase. Since the potential SEL is constant, the potential VS1 of the source of the transistor 12a and of the control gate of the transistor 14b increases. The potential VS2 of the control gate of the transistor 14a and of the source of the transistor 12b, on the contrary, will fall. At the same time, the potential OUT falls and reaches the value of the potential GND (corresponding typically to a low logic state).

The mirror formed by the transistors 18a and 18b is unbalanced so that it becomes possible to determine the potential at the output 3 when the potentials VS1 and VS2 are identical (this is the case if a cell that does not let through current is read, namely if Ic=0). In this case, the potential OUT remains at the value of the potential VCC.

If the read circuit is used to read cells accessible by means of two complementary bit lines (as in the case of SRAMs, for example), both inputs 2a and 2b are used, each of them being connected to the one of the lines. It will then be possible to use a balanced mirror in the stage 6b, since there cannot then be any balancing of the inputs 2a and 2b.

Figure 3:
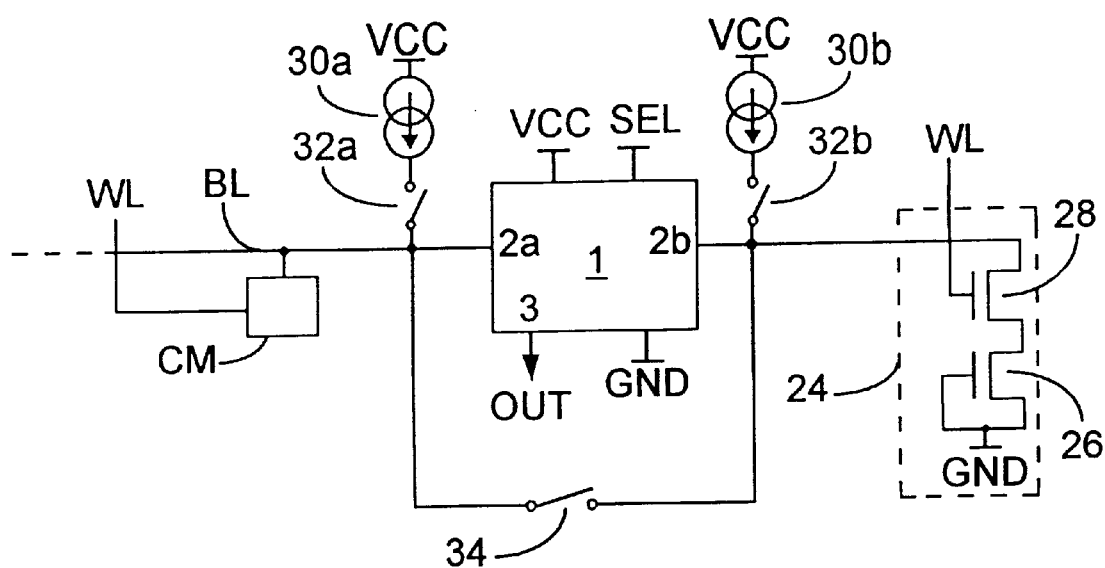
FIG. 3 shows an example of an implementation of the circuit of FIG. 2.

FIG. 3 illustrates an exemplary application of the circuit 1 of FIG. 2, in the case of a reading of a ROM or EPROM type memory. The input 2a is connected to a bit line BL that enables access to a cell CM when it is selected by a word line WL. The input 2b is connected to a reference circuit 24. In FIG. 3, the circuit 24 comprises an N channel MOS type transistor 26 connected to the input 2b by means of an N channel MOS type selection transistor 28 having its control gate connected to the word line WL. The source and the control gate of the transistor 24 receive the potential GND. The circuit 24 thus behaves like a cell that does not reroute any current. The use of a reference circuit makes it possible to minimize the effect of the capacitive couplings induced by the intersection of the word line and bit line associated with the cell CM, by reproducing this intersection at the second input 2b.

It will be possible, if necessary, to control the transistor 24 so that it lets through an intermediate current with a value ranging between the minimum and maximum values which can be taken by the current in a selected cell (values corresponding to the states of the cells). This provides a different way of doing away with the lack of determination between the inputs 2a and 2b when a selected cell does not let through current, as described with reference to FIG. 2 (where the lack of determination is removed by setting up an unbalance in the stage 6b, when the input 2b is not used).

It will also be possible to use devices for the precharging and balancing of the line or lines connected to the inputs of the read circuit. Thus, FIG. 3 shows current sources 30a and 30b connected to the inputs 2a and 2b by the means of two switches 32a and 32b. The use of sources 30a and 30b giving a major current makes it possible to rapidly charge the capacitive loads present at the inputs 2a and 2b. Once charged, these sources are isolated from the inputs and the reading can be done with weak currents in the range of about 100 microamperes. In the absence of sources 30a and 30b of this kind, the inputs are charged by means of the current sources of the read circuit. Furthermore, a switch has been shown, making it possible to connect the two inputs 2a and 2b to each other. Thus, it is possible to balance the potentials of these inputs before the reading operation and to decrease the response time of the read circuit.

The read circuit described makes it possible to read the state of the cells by giving the bit line only the current that can go through them. Indeed, the potential of the line does not vary once it is charged, and this is the case whatever the number of cells selected successively. The absolute value of the equivalent capacitive load of the line therefore has no impact on the time of access to the cells. It is possible to ensure an access time that is independent of the size of the bit line, at least so long as the resistance of the line can be overlooked (in practice this corresponds to a very significant number of cells, in the range of about a thousand). The read circuit could thus be used for memories of variable size, without modifying the reading time. There will be no need to adapt the read circuit to each individual case, thus simplifying the task of the designers of dedicated circuits.

Furthermore, the fact that it is possible to read the contents of several cells of a line while charging this line only once makes it possible to decrease the consumption of the read circuit in comparison with the read circuits based on a reading of the potential of the line. As has been seen, it is indeed possible to limit the operating current of the first stage to a few hundreds of microamperes. This is highly advantageous for onboard memories. Moreover, since the reading is made in terms of current, the circuit proposed is less sensitive to unwanted noise on the supplies.

On the assumption that both inputs 2a and 2b are used, this independence of the reading as a function of the capacitive loads at the inputs makes it possible to overlook the difference in load between these inputs. It is therefore possible to ensure faster access time to the contents of the cells.

In the case of memories without complementary bit lines, the invention makes it possible to use a read circuit without a reference line, only one input being then used. This makes it possible to facilitate the designing of the circuits and decrease the amount of space required for the memories.

That which is claimed:

1. A read circuit for a memory of a type comprising a plurality of memory cells and a plurality of bit lines connected thereto, said read circuit comprising:

at least one first input to be connected to a bit line to which memory cells are connected;

a first current source producing a first current;

a current-voltage converter producing an output logic signal representing a value of a second current obtained by rerouting a part of the first current towards the bit line when one of the cells is read so that, once the bit line is charged, the value of this second current is determined solely by a state of the selected cell and is independent of a capacitive load of the bit line, said current-voltage converter comprising a first current-voltage conversion stage producing, from the second current, a potential difference that represents a value of the second current; and a second voltage-voltage conversion stage receiving the potential difference of the first stage and producing therefrom the output logic signal as an output logic potential.

2. A read circuit according to claim 1, further comprising a second input to be connected to a reference circuit; wherein said first stage produces a reference current and the potential difference being produced is a function of relative values of the second current and of a third current obtained by rerouting a part of the reference current towards the reference circuit.

3. A read circuit according to claim 1, wherein said first stage further comprises:

a first arm comprising at least two first transistors series-connected with the first current source, and producing a first potential representing current through said two first transistors; and a second arm comprising a second current source producing the reference current and at least two second transistors that are series-connected with the second current source for producing a second potential representing current through said at least two second transistors.

4. A read circuit according to claim 3, wherein, for each arm, one of the transistors has a channel traversed respectively by the second current and the third current with control gates being at a given potential and sources producing the first and second potentials.

5. A read circuit according to claim 2, wherein said second stage comprises an unbalanced differential pair so that the output potential produced has a first value when the second current and the third current are equal and so that it has a second value when the second current and third current are different.

6. A memory comprising:
   a plurality of memory cells and a plurality of bit lines connected thereto;
   a read circuit connected to said bit lines and comprising:
      at least one first input to be connected to a bit line to which memory cells are connected;
      a first current source producing a first current;
      a current-voltage converter producing an output logic signal representing a value of a second current obtained by rerouting a part of the first current towards the bit line when one of the cells is read so that, once the bit line is charged, the value of this second current is determined solely by a state of the selected cell and is independent of a capacitive load of the bit line, said current-voltage converter comprising:
         a first current-voltage conversion stage producing, from the second current, a potential difference that represents a value of the second current; and
         a second voltage-voltage conversion stage receiving the potential difference of the first stage and producing therefrom the output logic signal as an output logic potential.

7. A memory according to claim 6, further comprising a second input to be connected to a reference circuit; wherein said first stage produces a reference current and the potential difference being produced is a function of relative values of the second current and of a third current obtained by rerouting a part of the reference current towards the reference circuit.

8. A memory according to claim 6, wherein said first stage further comprises:
   a first arm comprising at least two first transistors series-connected with the first current source, and producing a first potential representing current through said two first transistors; and
   a second arm comprising a second current source producing the reference current and at least two second transistors that are series-connected with the second current source for producing a second potential representing current through said at least two second transistors.

9. A memory according to claim 8, wherein, for each arm, one of the transistors has a channel traversed respectively by the second current and the third current with control gates being at a given potential and sources producing the first and second potentials.

10. A memory according to claim 6, wherein the second stage comprises an unbalanced differential pair so that the output potential produced has a first value when the second current and the third current are equal and so that it has a second value when the second current and third current are different.

11. A read circuit for a memory of a type comprising a plurality of memory cells and a plurality of bit lines connected thereto, said read circuit comprising:
    at least one first input to be connected to a bit line to which memory cells are connected;
    a first current source producing a first current; and
    a current-voltage converter producing an output logic potential representing a value of a second current obtained by rerouting a part of the first current towards the bit line when one of the cells is read so that, once the bit line is charged, the value of this second current is determined solely by a state of the selected cell and is independent of a capacitive load of the bit line, said current-voltage converter comprising:
       a first current-voltage conversion stage producing, from the second current, a potential difference that represents a value of the second current; and
       a second voltage-voltage conversion stage receiving the potential difference of the first stage and producing therefrom the output logic potential.

12. A read circuit according to claim 11, further comprising a second input to be connected to a reference circuit; wherein said first stage produces a reference current and the potential difference being produced is a function of relative values of the second current and of a third current obtained by rerouting a part of the reference current towards the reference circuit.

13. A read circuit according to claim 12, wherein the first stage further comprises:
    a first arm comprising at least two first transistors series-connected with the first current source, and producing a first potential representing current through said two first transistors; and
    a second arm comprising a second current source producing the reference current and at least two second transistors that are series-connected with the second current source for producing a second potential representing current through said at least two second transistors.

14. A read circuit according to claim 13, wherein, for each arm, one of the transistors has a channel traversed respectively by the second current and the third current with control gates being at a given potential and sources producing the first and second potentials.

15. A read circuit according to claim 12, wherein said second stage comprises an unbalanced differential pair so that the output potential produced has a first value when the second current and the third current are equal and so that it has a second value when the second current and third current are different.

16. A method for reading a memory of a type comprising a plurality of memory cells and a plurality of bit lines connected thereto, the method comprising the steps of:
    connecting to a bit line to which memory cells are connected;
    producing a first current;
    performing a current-voltage conversion to produce an output logic signal representing a value of a second current obtained by rerouting a part of the first current towards the bit line when one of the cells is read so that, once the bit line is charged, the value of this second current is determined solely by a state of the selected cell and is independent of a capacitive load of the bit line, the step of performing the current-voltage conversion comprises the steps of
       producing, from the second current, a potential difference that represents a value of the second current; and producing the output logic signal as an output logic potential based upon the potential difference.

17. A method according to claim 15, further comprising the steps of:

connecting a second input to a reference circuit; and producing the potential difference as a function of relative values of the second current and of a third current obtained by rerouting a part of the reference current towards the reference circuit.

* * * * *

UNITED STATES PATENT AND TRADEMARK OFFICE
CERTIFICATE OF CORRECTION

PATENT NO. : 5,898,622
DATED : Apr. 27, 1999
INVENTOR(S) : Richard Ferrant

It is certified that error appears in the above-indentified patent and that said Letters Patent is hereby corrected as shown below:

On title page, item

[30] Foreign Application Priority Data

Delete      "Sep. 10, 1997"
    and
        Insert:    -- Nov. 28, 1996 --

Signed and Sealed this

Fifth Day of October, 1999

*Attest:*

Q. TODD DICKINSON

*Attesting Officer*      *Acting Commissioner of Patents and Trademarks*